(12) United States Patent
Chen et al.

(10) Patent No.: US 11,838,015 B2
(45) Date of Patent: Dec. 5, 2023

(54) DRIVING METHOD AND DRIVING CIRCUIT

(71) Applicant: SILERGY SEMICONDUCTOR TECHNOLOGY (HANGZHOU) LTD, Zhejiang (CN)

(72) Inventors: Zhan Chen, Zhejiang (CN); Jian Deng, Zhejiang (CN); Qiukai Huang, Zhejiang (CN)

(73) Assignee: SILERGY SEMICONDUCTOR TECHNOLOGY (HANGZHOU) LTD, Hangzhou (CN)

( * ) Notice: Subject to any disclaimer, the term of this patent is extended or adjusted under 35 U.S.C. 154(b) by 0 days.

(21) Appl. No.: 17/830,651

(22) Filed: Jun. 2, 2022

(65) Prior Publication Data
US 2022/0399888 A1    Dec. 15, 2022

(30) Foreign Application Priority Data

Jun. 10, 2021 (CN) .......................... 202110647043.9

(51) Int. Cl.
*H03K 17/10* (2006.01)
*H03K 17/16* (2006.01)
*H03K 17/687* (2006.01)
*H03K 17/06* (2006.01)

(52) U.S. Cl.
CPC ......... *H03K 17/687* (2013.01); *H03K 17/102* (2013.01); *H03K 17/162* (2013.01); *H03K 2017/066* (2013.01)

(58) Field of Classification Search
None
See application file for complete search history.

(56) References Cited

U.S. PATENT DOCUMENTS

| | | | |
|---|---|---|---|
| 9,425,785 B1 | 8/2016 | Wibben | |
| 10,461,730 B1* | 10/2019 | Mariconti | ............ H03K 17/168 |
| 10,554,202 B2* | 2/2020 | Nomura | ................. H02M 1/08 |
| 10,911,045 B1* | 2/2021 | Ming | ............... H03K 17/04123 |

FOREIGN PATENT DOCUMENTS

CN    107493095 B    6/2020

OTHER PUBLICATIONS

Extended European Search Report dated Oct. 25, 2022, in corresponding European Application No. 22176113.3.

* cited by examiner

*Primary Examiner* — Kenneth B Wells
(74) *Attorney, Agent, or Firm* — Harness, Dickey & Pierce, P.L.C.

(57) ABSTRACT

A driving circuit and a driving method are provided. According to embodiments of the present disclosure, a power switch is driven by constant voltage or constant current during different time periods. The power switch is driven by using a first driving current during a Miller platform period, and the power switch is driven by using a second driving current when the Miller platform period ends, where the first driving current is less than the second driving current, so as to optimize EMI, reduce loss and improve efficiency.

16 Claims, 4 Drawing Sheets

DRIVING METHOD AND DRIVING CIRCUIT

CROSS REFERENCE OF RELATED APPLICATION

This application claims the priority to Chinese Patent Application No. 202110647043.9, titled "DRIVING METHOD AND DRIVING CIRCUIT", filed on Jun. 10, 2021 with the China National Intellectual Property Administration, the contents of which are incorporated herein by reference.

FIELD

The present disclosure relates to the field of power electronics, and in particular, to a driving circuit and a driving method.

BACKGROUND

In a switching power supply, a power switch operates at a high switching frequency to control transmission of energy, and thus a driving manner of the power switch has a great impact on the performance of the switching power supply. If the driving capability is too strong (that is, a driving current is too large), voltage and current of the power switch change greatly, resulting in serious electromagnetic interference (EMI). If the driving capability is too weak (that is, the driving current is too small), the power switch operates at a low switching frequency, resulting in large switching loss. In the switching power supply, a resistor is normally connected in series at a gate of the power switch, and the driving capability of the power switch is adjusted by adjusting resistance of the resistor. In a case that the resistance is large, the driving current is small and the EMI interference is small, and the switching loss of the power switch is large. In a case that the resistance is small, the driving current is large, the switching loss of the power switch is small, and the EMI interference is large.

SUMMARY

In view of this, a driving circuit and a driving method for a power switch of a switching power supply are provided according to embodiments of the present disclosure, to improve electromagnetic interference (EMI) without increasing loss.

A driving method for a power switch of a switching power supply is provided according to a first aspect of the embodiments of the present disclosure.

The driving method includes:

driving, when a driving voltage of the power switch reaches a first threshold, the power switch by using a first driving current until a Miller platform period ends; and driving, when the Miller platform period ends, the power switch by using a second driving current until the driving voltage of the power switch increases to a second threshold;

where the first threshold is less than a Miller platform voltage of the power switch, the second threshold is greater than the Miller platform voltage, and the first driving current is less than the second driving current.

In an embodiment, the first threshold is determined according to a turn-on threshold voltage of the power switch.

In an embodiment, the driving method further includes:

driving, when the driving voltage of the power switch is less than the first threshold, the power switch by using a third driving current until the driving voltage of the power switch increases from zero to the first threshold;

wherein the first driving current is less than the third driving current.

In an embodiment, the driving method further includes:

driving, when the driving voltage of the power switch is less than the first threshold, the power switch by using the first driving current, to control the driving voltage of the power switch to increase from zero to the first threshold.

In an embodiment, the driving method further includes:

generating by a current source, when the driving voltage of the power switch reaches the first threshold, the first driving current to drive the power switch until the Miller platform period ends; and generating by a second constant voltage driving circuit coupled in parallel with the current source, when the Miller platform period ends, the second driving current together with the current source to drive the power switch until the driving voltage of the power switch increases from the Miller platform voltage to the second threshold;

where the second constant voltage driving circuit is configured to generate the second threshold.

In an embodiment, the driving method further includes:

generating by a first constant voltage driving circuit coupled in parallel with the current source, when the driving voltage of the power switch is less than the first threshold, a third driving current together with the current source to drive the power switch until the driving voltage of the power switch increases from zero to the first threshold;

where the first constant voltage driving circuit is configured to generate the first threshold, and the first driving current is less than the third driving current.

In an embodiment, the driving method further includes:

generating by a current source, the first driving current to drive the power switch until the Miller platform period ends; and generating by a second constant voltage driving circuit coupled in parallel with the current source, when the Miller platform period ends, the second driving current together with the current source to drive the power switch until the driving voltage of the power switch increases from the Miller platform voltage to the second threshold;

wherein the second constant voltage driving circuit is configured to generate the second threshold.

In an embodiment, the driving method further includes:

generating by a third constant voltage driving circuit, when the driving voltage of the power switch reaches the first threshold, the first driving current to drive the power switch until the driving voltage of the power switch increases from the first threshold to a third threshold; and generating by a second constant voltage driving circuit, when the driving voltage of the power switch reaches the third threshold, the second driving current to drive the power switch until the driving voltage of the power switch increases from the third threshold to the second threshold;

wherein the second constant voltage driving circuit is configured to generate the second threshold, and the third constant voltage driving circuit is configured to generate the third threshold.

In an embodiment, the driving method further includes:

generating by a first constant voltage driving circuit, when the driving voltage of the power switch is less than the first threshold, a third driving current to drive the power switch until the driving voltage of the power switch increases from zero to the first threshold;

wherein the first constant voltage driving circuit is configured to generate the first threshold, and the first driving current is less than the third driving current.

In an embodiment, the driving method further includes:

generating by a third constant voltage driving circuit, the first driving current to drive the power switch until the driving voltage of the power switch increases from zero to a third threshold; and generating by a second constant voltage driving circuit, the second driving current to drive the power switch until the driving voltage of the power switch increases from the third threshold to the second threshold;

wherein the second constant voltage driving circuit is configured to generate the second threshold, and the third constant voltage driving circuit is configured to generate the third threshold.

A driving circuit for a power switch of a switching power supply is provided according to a second aspect of the embodiments of the present disclosure.

The driving circuit is configured to:

drive, when a driving voltage of the power switch reaches a first threshold, the power switch by using a first driving current until a Miller platform period ends; and drive, when the Miller platform period ends, the power switch by using a second driving current until the driving voltage of the power switch increases to a second threshold;

wherein the first threshold is less than a Miller platform voltage of the power switch, the second threshold is greater than the Miller platform voltage, and the first driving current is less than the second driving current.

In an embodiment, the first threshold is determined according to a turn-on threshold voltage of the power switch.

In an embodiment, the driving circuit is further configured to:

drive, when the driving voltage of the power switch is less than the first threshold, the power switch by using a third driving current until the driving voltage of the power switch increases from zero to the first threshold;

wherein the first driving current is less than the third driving current.

In an embodiment, the driving circuit is further configured to:

drive, when the driving voltage of the power switch is less than the first threshold, the power switch by using the first driving current, to control the driving voltage of the power switch to increase from zero to the first threshold.

In an embodiment, the driving circuit includes:

a current source, configured to generate, when the driving voltage of the power switch reaches the first threshold, the first driving current to drive the power switch until the Miller platform period ends; and a second constant voltage driving circuit coupled in parallel with the current source, configured to generate, when the Miller platform period ends, the second driving current together with the current source to drive the power switch until the driving voltage of the power switch increases from the Miller platform voltage to the second threshold;

where the second constant voltage driving circuit is configured to generate the second threshold.

In an embodiment, the driving circuit includes:

a first constant voltage driving circuit coupled in parallel with the current source, configured to generate, when the driving voltage of the power switch is less than the first threshold, a third driving current together with the current source to drive the power switch until the driving voltage of the power switch increases from zero to the first threshold;

where the first constant voltage driving circuit is configured to generate the first threshold, and the first driving current is less than the third driving current.

In an embodiment, the driving circuit includes:

a current source, configured to generate the first driving current to drive the power switch until the Miller platform period ends and a voltage of a gate of the power switch increases from zero to the Miller platform voltage; and a second constant voltage driving circuit coupled in parallel with the current source, configured to generate, when the Miller platform period ends, the second driving current together with the current source to drive the power switch until the driving voltage of the power switch increases from the Miller platform voltage to the second threshold;

where the second constant voltage driving circuit is configured to generate the second threshold.

In an embodiment, the driving circuit includes:

a third constant voltage driving circuit, configured to generate, when the driving voltage of the power switch reaches the first threshold, the first driving current to drive the power switch until the driving voltage of the power switch increases from the first threshold to a third threshold; and a second constant voltage driving circuit, configured to generate, when the driving voltage of the power switch reaches the third threshold, the second driving current to drive the power switch until the driving voltage of the power switch increases from the third threshold to the second threshold;

wherein the second constant voltage driving circuit is configured to generate the second threshold, and the third constant voltage driving circuit is configured to generate the third threshold.

In an embodiment, the driving circuit includes:

a first constant voltage driving circuit, configured to generate, when the driving voltage of the power switch reaches the first threshold, a third driving current to drive the power switch until the driving voltage of the power switch increases from zero to the first threshold;

where the first constant voltage driving circuit is configured to generate the first threshold, and the first driving current is less than the third driving current.

In an embodiment, the driving circuit includes:

a variable resistive element, coupled in series with the current source, where a current flowing through the current source is determined according to resistance of the variable resistive element.

According to the embodiments of the present disclosure, a power switch is driven by constant voltage or constant current during different time periods. The power switch is driven by using a small driving current during a Miller platform period, and the power switch is driven by using a large driving current when the Miller platform period ends, so as to optimize EMI, reduce loss and improve efficiency.

BRIEF DESCRIPTION OF THE DRAWINGS

The above and other objects, features and advantages of the present disclosure will become clearer by describing the embodiments of the present disclosure below with reference to the drawings. In the drawings.

DETAILED DESCRIPTION

The present disclosure is described below based on embodiments. However, the present disclosure is not limited to these embodiments. In the description of details of the present disclosure hereinafter, some specific details are described. Those skilled in the art can completely understand the present disclosure without the description of the details. In order to avoid obscuring the substance of the present disclosure, well-known methods, procedures, processes, elements and circuits are not described in detail.

In addition, those skilled in the art should understand that the drawings are provided herein for illustration, and are not necessarily drawn to scale.

In addition, it should be understood that in the following description, the term "circuit" indicates a conductive loop formed by at least one element or sub-circuit through electrical connection or electromagnetic connection. When an element or circuit is described as "connected to" another element or when an element or circuit is described as "connected" between two nodes, the element or circuit may be directly coupled or connected to another element, or there is other element between the element or circuit and another element. The connection between elements may be physical, logical, or a combination thereof. In addition, when an element is described as "directly coupled" or "directly connected" to another element, there is no element between the element and another element.

Unless explicitly indicated herein, the words "including", "comprising" and the like in the specification and the claim should be interpreted as inclusive rather than exclusive or exhaustive, that is, "including but not limited to".

In the description of the present disclosure, it should be understood that the terms "first", "second" and the like are used only for illustrative and should not be construed as indicating or implying relative importance. In addition, in the description of the present disclosure, the term "multiple" or "a plurality of" indicates two or more unless otherwise specified.

Figure 1:
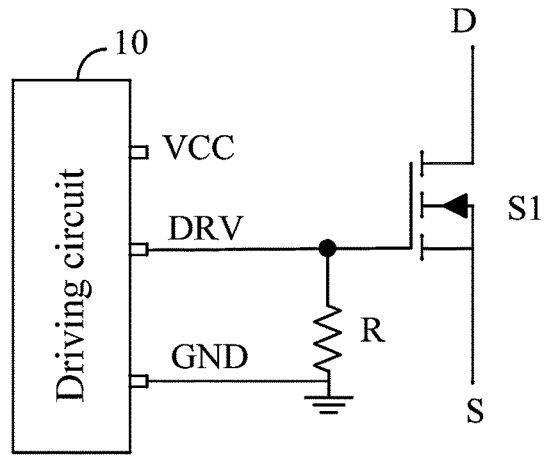
FIG. 1 is a diagram showing a switching power supply circuit according to an embodiment of the present disclosure.

FIG. 1 is a diagram showing a switching power supply circuit according to an embodiment of the present disclosure. In the embodiment, the switching power supply includes a power switch S1 and a driving circuit 10. The driving circuit 10 is configured to control the power switch S1 to be turned on or off, to adjust an output voltage or an output current of the switching power supply. A source S of the power switch S1 may be directly coupled to a reference ground GND, or coupled to the reference ground GND through a sampling resistor or the like. A drain D of the power switch S1 is connected to a power stage circuit of the switching power supply, such as an inductor. It should be understood that although FIG. 1 shows that the power switch S1 is an n-type MOSFET, the power switch S1 may be any type of field effect transistor. Further, the power switch S1 may include other types of transistors without departing from the scope of the present disclosure.

The driving circuit 10 may be an integrated circuit having an independent package and related input pins and output pins, and may be arranged on a printed circuit board having a circuit component with a switching power supply, or arranged on an independent printed circuit board with a corresponding integrated circuit. The driving circuit 10 includes an input pin receiving a power supply voltage VCC, a grounding pin connected to the reference ground GND, and an output pin generating a driving voltage DRV. The driving circuit 10 continuously charges a gate of the power switch S1 through the output pin, and the driving voltage DRV continuously increases to control the power switch S1 to be turned on. A variable resistive element R is connected between the output pin and the reference ground GND, and is configured to set a driving current flowing through the output pin. It should be understood that the driving circuit is not limited in the embodiment, and other circuits with similar structure or function are also applicable to the embodiment.

In a packaging application, the driving circuit 10 and the power switch S1 are packaged separately. In another packaging application, the driving circuit 10 and the power switch S1 are packaged together to form a chip to meet different application requirements.

In the embodiment, the driving circuit 10 is configured to: drive, when the driving voltage DRV of the power switch S1 reaches a first threshold, the gate of the power switch S1 by using a small driving current until a Miller platform period ends; and drive, when the Miller platform period ends, the gate of the power switch S1 by using a large driving current until the driving voltage of the power switch S1 increases to a second threshold. The first threshold is less than a Miller platform voltage of the power switch, and the second threshold is greater than the Miller platform voltage of the power switch. In the embodiment, the first threshold is determined according to a turn-on threshold voltage of the power switch. The power switch S1 is turned on when the driving voltage DRV reaches the turn-on threshold voltage of the power switch S1. The driving voltage DRV of the power switch S1 enters a Miller platform period with the change of the driving voltage DRV. During the Miller platform period, the driving voltage DRV of the power switch S1 does not continue to increase according to an original slope for a time period, and a voltage of the drain of the power switch S1 is high and power consumption is high due to the Miller effect. Therefore, the power switch S1 is driven by using a small driving current during the Miller platform period until the Miller platform period ends, which can reduce a falling slope of the voltage of the drain of the power switch S1, so as to optimize electromagnetic interference (EMI). When the Miller platform period ends, the power switch S1 is completely turned on, the voltage of the drain of the power switch S1 is very small, and on-resistance of the power switch S1 is small. Therefore, the power switch S1 is driven by using a large driving current when the Miller platform period ends, so as to reduce conduction loss, thereby improving the efficiency.

In an embodiment, the driving circuit 10 is configured to drive the power switch S1 to be turned on in two phases. The driving process includes the following phases.

During a first phase, the driving voltage DRV of the power switch S1 increases from zero until the Miller platform period ends. Specifically, the first phase includes a time period in which the driving voltage DRV increases from zero to a first threshold Y1, a time period in which the first threshold Y1 increases to the Miller platform voltage, and the Miller platform period. During this phase, the driving circuit 10 drives the gate of the power switch S1 by using a small driving current. In the embodiment, the first threshold Y1 is determined according to a turn-on threshold voltage Vth of the power switch S1, and the turn-on threshold voltage Vth is slightly less than the Miller platform voltage.

During a second phase, the driving voltage DRV of the power switch S1 increases from the Miller platform voltage to a second threshold V2 when the Miller platform period ends. During this phase, the driving circuit 10 drives the gate of the power switch S1 by using a large driving current. In the embodiment, the second threshold V2 is determined according to the on-resistance and driving loss of the power switch S1. The small driving current is configured to be different from or consistent with a first driving current, the large driving current is configured to be different from or consistent with a second driving current, and the first driving current is less than the second driving current.

In another embodiment, the driving circuit 10 is configured to drive the power switch S1 to be turned on in three phases. The driving process includes the following phases.

During a first phase A, the driving voltage DRV of the power switch S1 increases from zero to the first threshold V1. During this phase, the driving circuit 10 drives the gate of the power switch S1 by using a large driving current.

A second phase B includes a time period in which the driving voltage DRV of the power switch S1 increases from the first threshold V1 to the Miller platform voltage, and the Miller platform period. During this phase, the driving circuit 10 drives the gate of the power switch S1 by using a small driving current.

During a third phase C, the driving voltage DRV of the power switch S1 increases from the Miller platform voltage to a second threshold V2 when the Miller platform period ends. During this phase, the driving circuit 10 drives the gate of the power switch S1 by using a large driving current. The small driving current is configured to be different from or consistent with a first driving current or a third driving current, the large driving current is configured to be different from or consistent with a second driving current, and the first driving current is less than the second driving current, and the first driving current is less than the third driving current.

Figure 2:
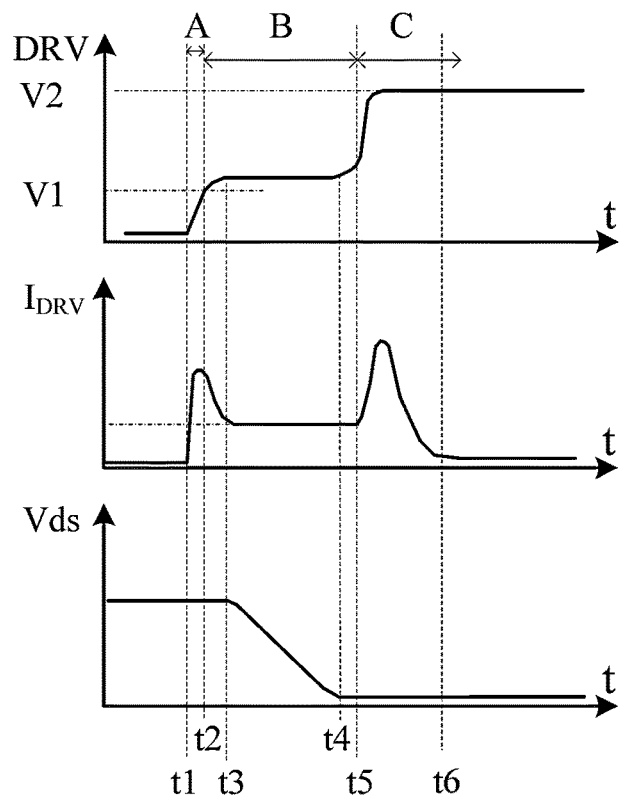
FIG. 2 is a diagram showing a signal waveform in a driving process according to an embodiment of the present disclosure.

FIG. 2 is a diagram showing a signal waveform in a driving process according to an embodiment of the present disclosure. The first phase A corresponds to a time interval from a time instant t1 to a time instant t2 in FIG. 2, in which the driving voltage DRV of the power switch S1 gradually increases from zero to the first threshold V1. During the time interval from the time instant t1 to the time instant t2, the driving current $I_{DRV}$ is a large first current, and a voltage Vds of a drain source of the power switch S1 remains basically unchanged.

The second phase B corresponds to a time interval from the time instant t2 to a time instant t5 in FIG. 2, in which the driving voltage DRV of the power switch S1 increases from the first threshold V1 to the Miller platform voltage at a time instant t3, and then remains at the Miller platform voltage. During the time interval from the time instant t2 to the time instant t5, the driving current $I_{DRV}$ is a small second current, to control the voltage Vds of the drain source of the power switch S1 to decrease slowly, so as to optimize EMI.

The third phase C corresponds to a time interval from the time instant t5 to a time instant t6 in FIG. 2, in which the driving voltage DRV of the power switch S1 increases from the Miller platform voltage to the second threshold V2, and then remains at the second threshold V2. During the time interval from the time instant t5 to the time instant t6, the driving current $I_{DRV}$ is a large third current, the voltage of the drain of the power switch S1 is small, and the on-resistance of the power switch S1 is small, so as to reduce conduction loss, thereby improving the efficiency. It should be understood that in the embodiment, compared with the second current, the first current and the third current are large driving currents. As long as the first current and the third current are greater than the second current, current amplitude is not limited. Compared with the driving process in the two phases, in the driving process according to the embodiment, the power switch is driven by using a large driving current until the driving voltage DRV of the power switch S1 increases from zero to the first threshold V1, so as to shorten a turn-on time period of the power switch S1, thereby improving the efficiency, especially suitable for a switching power supply operating at a high-frequency.

Figure 3:
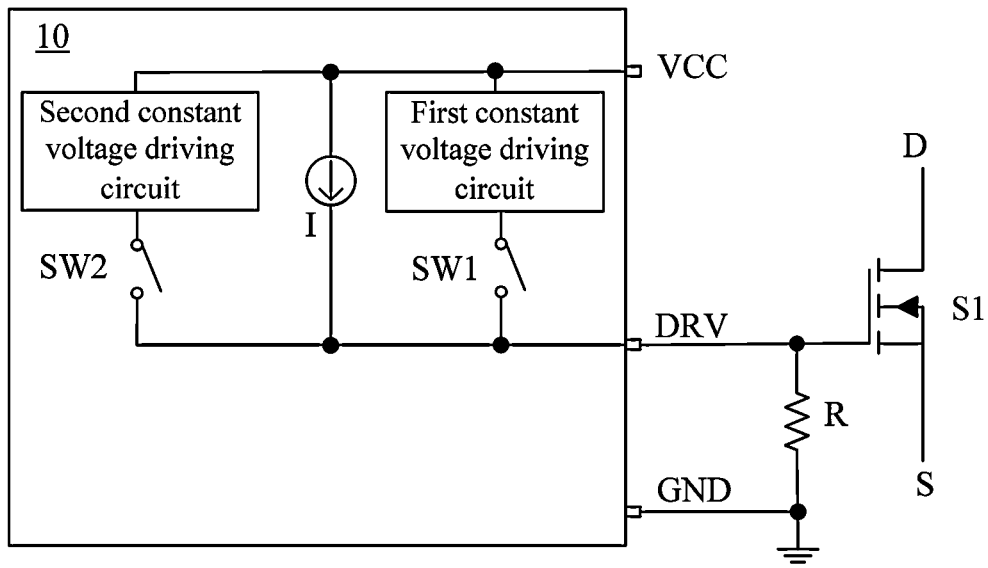
FIG. 3 is a diagram of a driving circuit according to a first embodiment of the present disclosure.

FIG. 3 is a diagram of a driving circuit according to a first embodiment of the present disclosure. In the embodiment, the driving circuit is configured to achieve a driving process in the three phases. As shown in FIG. 3, the driving circuit 10 includes a first constant voltage driving circuit, a second constant voltage driving circuit, a current source I, a switch SW1 and a switch SW2. The first constant voltage driving circuit, the second constant voltage driving circuit and the current source I are coupled in parallel with each other. In the embodiment, the first constant voltage driving circuit generates the first threshold V1, and the second constant voltage driving circuit generates the second threshold V2. During the first phase A, the switch SW1 is turned on, the first constant voltage driving circuit and the current source I are connected in parallel between an input voltage VCC and an output pin, and the first constant voltage driving circuit and the current source I start to operate simultaneously, to generate a large driving current at the output pin to drive the power switch S1, so that the driving voltage DRV of the power switch S1 increases from zero to the first threshold V1. When the driving voltage DRV of the power switch S1 reaches the first threshold V1, the first constant voltage driving circuit does not generate the driving current, and only the current source I provides the driving current to the power switch S1. During the first phase B, only the current source I operates to generate a small driving current to drive the power switch S1, so that the driving voltage DRV of the power switch S1 increases from the first threshold V1 to the Miller platform voltage, and then remains at the Miller platform voltage. During the third phase C, the Miller platform period ends, the switch SW2 is turned on, the second constant voltage driving circuit and the current source I are connected in parallel between the input voltage VCC and the output pin, and the second constant voltage driving circuit and the current source I start to operate simultaneously, to generate a large driving current at the output pin to drive the power switch S1, so that the driving voltage DRV of the power switch S1 increases from the Miller platform voltage to the second threshold V2. In the embodiment, the switch SW1 is always turned on from when the driving circuit starts to operate, and the switch SW2 is turned on from when the Miller platform period ends, and the switch SW1 and the switch SW2 may be controlled in various manners. In an embodiment, the switch SW2 is controlled to be turned on when the switch SW1 is turned on for a first time period or the first constant voltage driving circuit operates for the first time period. An end time instant of the first time period is an end time instant of the Miller platform period. In another embodiment, the switch SW2 is turned on when the driving circuit 10 detects that the driving voltage DRV of the power switch S1 reaches the first threshold V1 for a second time period. The second time period is greater than or equal to the Miller platform period. In the embodiment, the driving current generated by the current source I may be set through the variable resistive element R. A terminal of the variable resistive element R is connected to the driving voltage DRV and another terminal of the variable resistive element R is connected to the reference ground. The current generated by the current source I may be determined according to resistance of the variable resistive element R, to achieve better compromise between EMI and conduction loss, so as to meet different applications.

Figure 4:
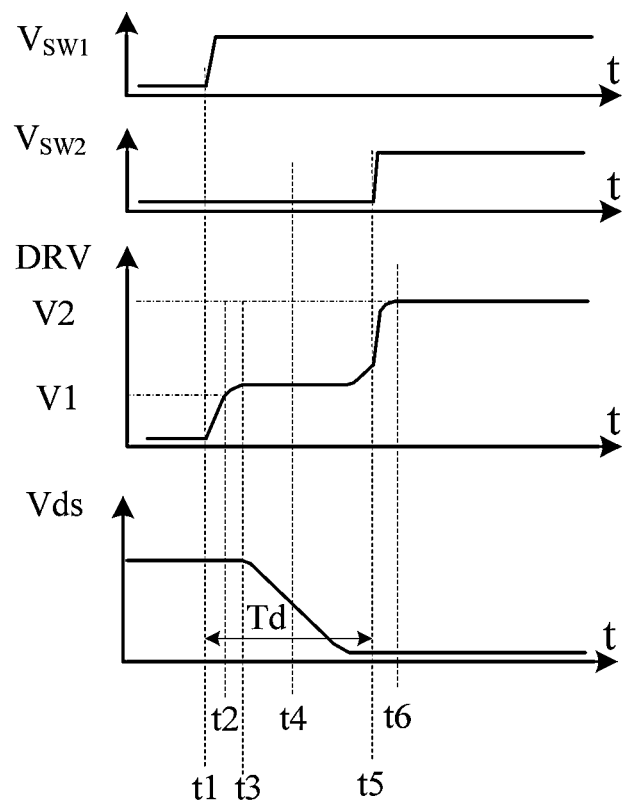
FIG. 4 is a diagram showing an operation waveform of the driving circuit according to the first embodiment of the present disclosure.

FIG. 4 is a diagram showing an operation waveform of the driving circuit according to the first embodiment of the present disclosure. As shown in FIG. 4, at a time instant t1, a control signal $V_{SW1}$ of the switch SW1 is controlled to be in a valid state, the switch SW1 is controlled to be turned on, the first constant voltage driving circuit and the current source I generate a large driving current to drive the power switch S1, and the driving voltage DRV of the power switch S1 increases from zero. At a time instant t2, the driving voltage DRV of the power switch S1 increases to the first threshold V1, the first constant voltage driving circuit does not generate the driving current, and then the current source I generates a small driving current to drive the power switch S1. At a time instant t3, the driving voltage DRV of the power switch S1 increases to the Miller platform voltage, and the Miller platform period is maintained until a time instant t5. At the time instant t5, that is, when the switch SW1 is turned on for a first time period Td, the driving circuit 10 controls a control signal $V_{SW2}$ of the switch SW2 to be in a valid state, to control the switch SW2 to be turned on. The second constant voltage driving circuit and the current source I generate a large driving current to drive the power switch S1, so that the driving voltage DRV of the power switch S1 increases rapidly from the Miller platform voltage. At a time instant t6, the driving voltage DRV of the power switch S1 increases to the second threshold V2 and remains unchanged.

Figure 5:
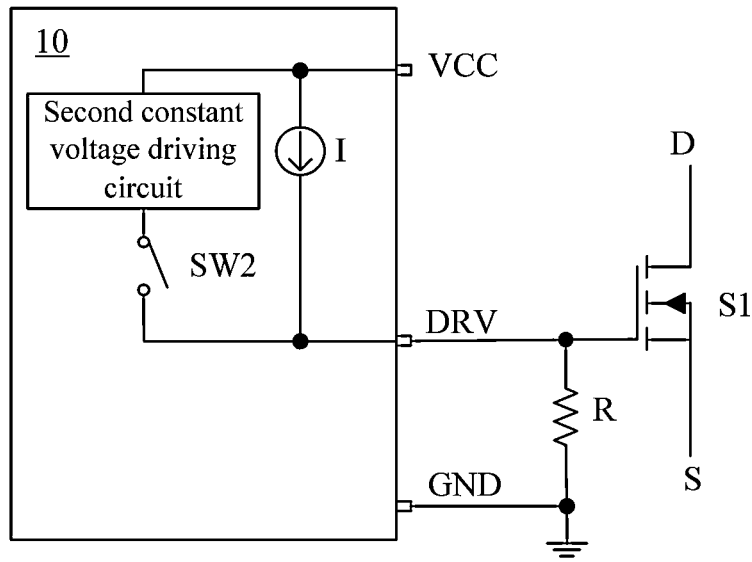
FIG. 5 is a diagram of a driving circuit according to a second embodiment of the present disclosure.

FIG. 5 is a diagram of a driving circuit according to a second embodiment of the present disclosure. In the embodiment, the driving circuit is configured to achieve a driving process in the two phases. As shown in FIG. 5, the driving circuit 10 includes a second constant voltage driving circuit, a current source I, and a switch SW2. The second constant voltage driving circuit and the current source I are coupled in parallel with each other. In the embodiment, the second constant voltage driving circuit generates the second threshold V2. During the first phase, the current source I is connected between an input voltage VCC and an output pin, to generate a small driving current at the output pin to drive the power switch S1, so that the driving voltage DRV of the power switch S1 increases from zero. The driving voltage DRV of the power switch S1 increases from zero to the Miller platform voltage, and enters the second phase when the Miller platform period ends. During the second phase, the switch SW2 is turned on, and the second constant voltage driving circuit and the current source I are connected in parallel between the input voltage VCC and the output pin, to generate a large driving current at the output pin to drive the power switch S1. During this phase, the driving voltage DRV increases from the Miller platform voltage to the second threshold V2. In the embodiment, the switch SW2 is turned on when the Miller platform period ends, and may be controlled in various manners. In an embodiment, the switch SW2 is controlled to be turned on when the current source I operates for the first time period. In another embodiment, the switch SW2 is turned on when the driving circuit 10 detects that the driving voltage DRV of the power switch S1 reaches the Miller platform voltage for a third time period. The third time period is greater than or equal to the Miller platform period.

Figure 6:
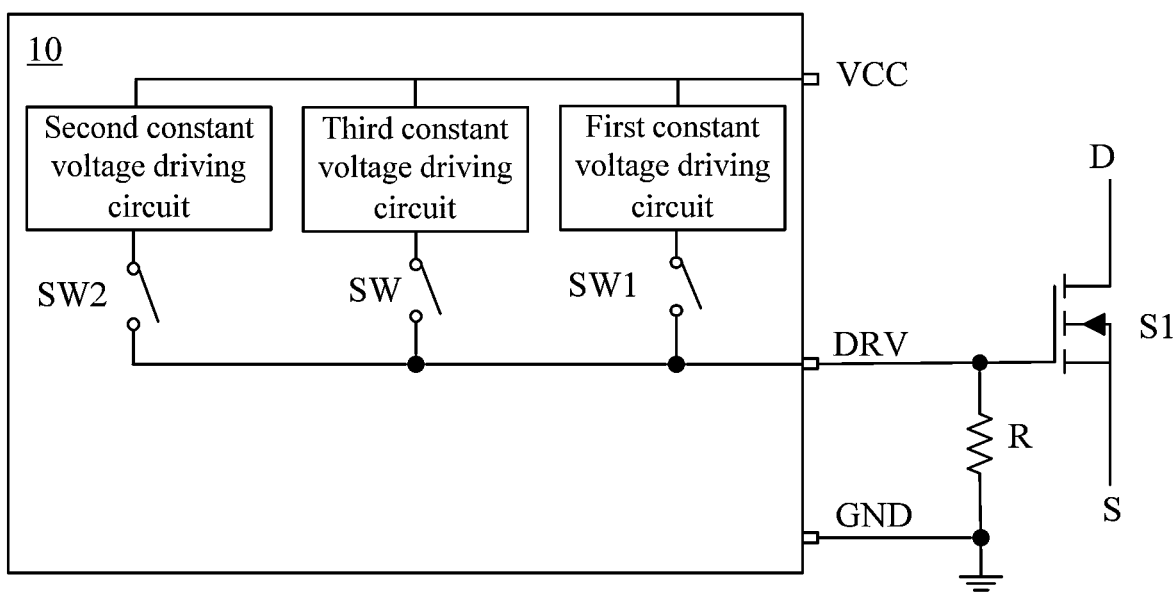
FIG. 6 is a diagram of a driving circuit according to a third embodiment of the present disclosure.

FIG. 6 is a diagram of a driving circuit according to a third embodiment of the present disclosure. In the embodiment, the driving circuit is configured to achieve the driving process in the three phases by using a constant voltage circuit. As shown in FIG. 6, the driving circuit 10 includes a first constant voltage driving circuit, a second constant voltage driving circuit, a third constant voltage driving circuit, a switch SW, a switch SW1 and a switch SW2. The first constant voltage driving circuit, the second constant voltage driving circuit and the third constant voltage driving circuit are coupled in parallel with each other. In the embodiment, the first constant voltage driving circuit generates the first threshold V1, the second constant voltage driving circuit generates the second threshold V2, and the third constant voltage driving circuit generates a third threshold. The third threshold is slightly greater than the Miller platform voltage. During the first phase, the switch SW1 is turned on, and the first constant voltage driving circuit is connected between an input voltage VCC and an output pin to generate a large driving current at the output pin to drive the power switch S1, so that the driving voltage DRV of the power switch S1 increases from zero. When the driving voltage DRV of the power switch S1 increases from zero to the first threshold V1, the first phase ends and the second phase starts, and the first constant voltage driving circuit does not generate the driving current. During the second phase, the switch SW is turned on, and the third constant voltage driving circuit is connected between the input voltage VCC and the output pin, and operates to generate a small driving current at the output pin to drive the power switch S1. During this phase, the driving voltage DRV of the power switch S1 increases from the first threshold V1 to the Miller platform voltage, increases from the Miller platform voltage to the third threshold, and then enters the third phase. During the third phase, the third constant voltage driving circuit does not generate the driving current, the switch SW2 is turned on, and the second constant voltage driving circuit is connected between the input voltage VCC and the output pin, and operates to generate a large driving current at the output pin to drive the power switch S1. During this phase, the driving voltage DRV of the power switch S1 increases from the third threshold to the second threshold V2 and remains at the second threshold V2.

Figure 7:
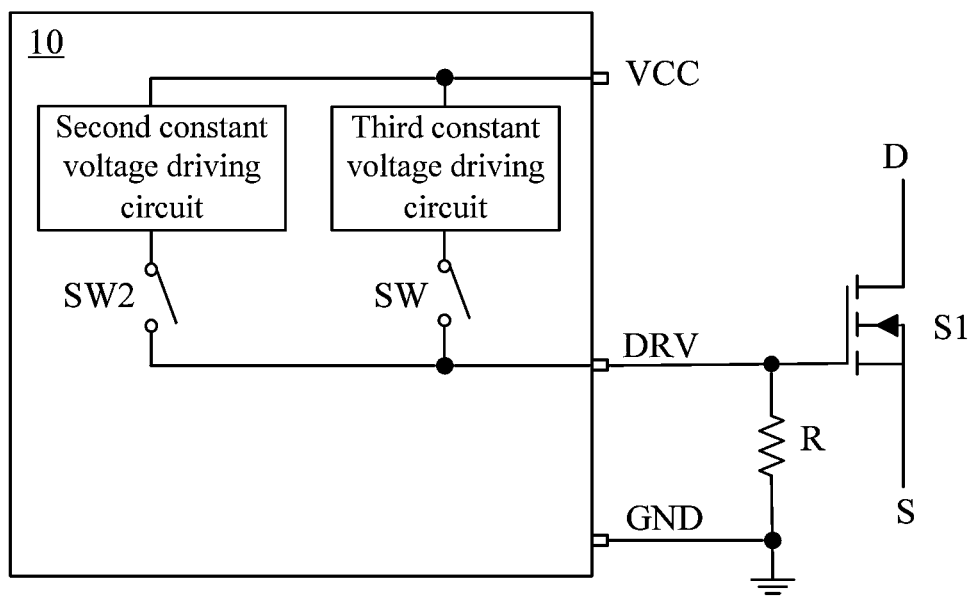
FIG. 7 is a diagram of a driving circuit according to a fourth embodiment of the present disclosure.

FIG. 7 is a diagram of a driving circuit according to a fourth embodiment of the present disclosure. In the embodiment, the driving circuit is configured to achieve the driving process in the two phases by using a constant voltage circuit. As shown in FIG. 7, the driving circuit 10 includes a second constant voltage driving circuit, a third constant voltage driving circuit, a switch SW and a switch SW2. The second constant voltage driving circuit connected and the third constant voltage driving circuit are coupled in parallel with each other. In the embodiment, the third constant voltage driving circuit generates the third threshold, and the second constant voltage driving circuit generates the second threshold V2. The third threshold is slightly greater than the Miller platform voltage, and the second threshold V2 is greater than the third threshold. The second threshold V2 is determined according to the on-resistance and driving loss of the power switch S1. During the first phase, the switch SW is turned on, and the third constant voltage driving circuit is connected between the input voltage VCC and the output pin to generate a small driving current at the output pin to drive the power switch S1, so that the driving voltage DRV of the power switch S1 increases from zero. When the driving voltage DRV of the power switch S1 increases from zero to the Miller platform voltage, and increases from the Miller platform voltage to the third threshold, the driving voltage DRV of the power switch S1 is in the second phase. During the second phase, the third constant voltage driving circuit does not generate the driving current, the switch SW2 is turned on, and the second constant voltage driving circuit is connected between the input voltage VCC and the output pin and operates to generate a large driving current at the output pin to drive the power switch S1. During this phase, the driving voltage DRV of the power switch S1 increases from the third threshold to the second threshold V2 and remains at the second threshold V2.

In the embodiment, a driving circuit drives a power switch by constant voltage or constant current during different time periods. The driving circuit drives the power switch by using a small driving current during a Miller platform period, and drives the power switch by using a large driving current when the Miller platform period ends, so as to optimize EMI, reduce loss and improve efficiency.

It should be noted that the "large" and "small" described in the "large driving current and small driving current" in the present disclosure are relative to each other and are not intended to limit the current amplitude.

The embodiments of the present disclosure are described above and are not intended to limit the present disclosure. Those skilled in the art can make various modifications and variations to the present disclosure. Any modifications, equivalent substitutions and improvements made within the spirit and the principle of the present disclosure are within the protection scope of the present disclosure.

The invention claimed is:

1. A driving method for a power switch of a switching power supply, comprising:
    driving, when a driving voltage of the power switch reaches a first threshold, the power switch by using a first driving current until a Miller platform period ends; and
    driving, when the Miller platform period ends, the power switch by using a second driving current until the driving voltage of the power switch increases to a second threshold;
    wherein the first threshold is less than a Miller platform voltage of the power switch, the second threshold is greater than the Miller platform voltage, and the first driving current is less than the second driving current;
    wherein the method further comprises:
    generating by a current source, the first driving current to drive the power switch until the Miller platform period ends; and
    generating by a second constant voltage driving circuit coupled in parallel with the current source, when the Miller platform period ends, the second driving current together with the current source to drive the power switch until the driving voltage of the power switch increases from the Miller platform voltage to the second threshold, wherein the second constant voltage driving circuit is configured to generate the second threshold.

2. The driving method according to claim 1, wherein the first threshold is determined according to a turn-on threshold voltage of the power switch.

3. The driving method according to claim 1, further comprising:
    driving, when the driving voltage of the power switch is less than the first threshold, the power switch by using a third driving current until the driving voltage of the power switch increases from zero to the first threshold;
    wherein the first driving current is less than the third driving current.

4. The driving method according to claim 1, further comprising:
    driving, when the driving voltage of the power switch is less than the first threshold, the power switch by using the first driving current, to control the driving voltage of the power switch to increase from zero to the first threshold.

5. The driving method according to claim 1, wherein the generating by a current source, the first driving current to drive the power switch until the Miller platform period ends comprises:
    generating by a current source, when the driving voltage of the power switch reaches the first threshold, the first driving current to drive the power switch until the Miller platform period ends.

6. The driving method according to claim 5, further comprising:
    generating by a first constant voltage driving circuit coupled in parallel with the current source, when the driving voltage of the power switch is less than the first threshold, a third driving current together with the current source to drive the power switch until the driving voltage of the power switch increases from zero to the first threshold;
    wherein the first constant voltage driving circuit is configured to generate the first threshold, and the first driving current is less than the third driving current.

7. A driving method for a power switch of a switching power supply, comprising:
    driving, when a driving voltage of the power switch reaches a first threshold, the power switch by using a first driving current until a Miller platform period ends; and
    driving, when the Miller platform period ends, the power switch by using a second driving current until the driving voltage of the power switch increases to a second threshold;
    wherein the first threshold is less than a Miller platform voltage of the power switch, the second threshold is greater than the Miller platform voltage, and the first driving current is less than the second driving current;
    wherein the method further comprises:
    generating by a third constant voltage driving circuit, the first driving current to drive the power switch until the driving voltage of the power switch increases from zero to a third threshold; and
    generating by a second constant voltage driving circuit, the second driving current to drive the power switch until the driving voltage of the power switch increases from the third threshold to the second threshold, wherein the second constant voltage driving circuit is configured to generate the second threshold, and the third constant voltage driving circuit is configured to generate the third threshold.

8. The driving method according to claim 7, wherein the generating by a third constant voltage driving circuit, the first driving current to drive the power switch until the driving voltage of the power switch increases from zero to a third threshold comprises:

generating by a third constant voltage driving circuit, when the driving voltage of the power switch reaches the first threshold, the first driving current to drive the power switch until the driving voltage of the power switch increases from the first threshold to a third threshold.

9. The driving method according to claim 8, further comprising:

generating by a first constant voltage driving circuit, when the driving voltage of the power switch is less than the first threshold, a third driving current to drive the power switch until the driving voltage of the power switch increases from zero to the first threshold;

wherein the first constant voltage driving circuit is configured to generate the first threshold, and the first driving current is less than the third driving current.

10. A driving circuit for a power switch of a switching power supply, wherein the driving circuit is configured to:

drive, when a driving voltage of the power switch reaches a first threshold, the power switch by using a first driving current until a Miller platform period ends; and drive, when the Miller platform period ends, the power switch by using a second driving current until the driving voltage of the power switch increases to a second threshold;

wherein the first threshold is less than a Miller platform voltage of the power switch, the second threshold is greater than the Miller platform voltage, and the first driving current is less than the second driving current;

wherein the driving circuit further comprises:

a current source, configured to generate the first driving current to drive the power switch until the Miller platform period ends and a voltage of a gate of the power switch increases from zero to the Miller platform voltage; and a second constant voltage driving circuit coupled in parallel with the current source, configured to generate, when the Miller platform period ends, the second driving current together with the current source to drive the power switch until the driving voltage of the power switch increases from the Miller platform voltage to the second threshold, wherein the second constant voltage driving circuit is configured to generate the second threshold.

11. The driving circuit according to claim 10, wherein the first threshold is determined according to a turn-on threshold voltage of the power switch.

12. The driving circuit according to claim 10, wherein the driving circuit is further configured to:

drive, when the driving voltage of the power switch is less than the first threshold, the power switch by using a third driving current until the driving voltage of the power switch increases from zero to the first threshold;

wherein the first driving current is less than the third driving current.

13. The driving circuit according to claim 10, wherein the driving circuit is further configured to:

drive, when the driving voltage of the power switch is less than the first threshold, the power switch by using the first driving current, to control the driving voltage of the power switch to increase from zero to the first threshold.

14. The driving circuit according to claim 10, wherein:

the current source is configured to generate, when the driving voltage of the power switch reaches the first threshold, the first driving current to drive the power switch until the Miller platform period ends.

15. The driving circuit according to claim 14, further comprising:

a first constant voltage driving circuit coupled in parallel with the current source, configured to generate, when the driving voltage of the power switch is less than the first threshold, a third driving current together with the current source to drive the power switch until the driving voltage of the power switch increases from zero to the first threshold;

wherein the first constant voltage driving circuit is configured to generate the first threshold, and the first driving current is less than the third driving current.

16. The driving circuit according to claim 14, further comprising:

a variable resistive element, coupled in series with the current source, wherein a current flowing through the current source is determined according to a resistance of the variable resistive element.

* * * * *